(12) United States Patent
Chang et al.

(10) Patent No.: US 8,842,146 B2
(45) Date of Patent: Sep. 23, 2014

(54) LIGHT EMITTING DIODE ARRAY STRUCTURE, AND PRINTING HEAD AND PRINTING DEVICE THEREOF

(71) Applicant: Nisho Image Tech Inc., New Taipei (TW)

(72) Inventors: Tz-Liang Chang, New Taipei (TW); Po-Hsiung Peng, New Taipei (TW)

(73) Assignee: Nisho Image Tech Inc., New Taipei (TW)

( * ) Notice: Subject to any disclaimer, the term of this patent is extended or adjusted under 35 U.S.C. 154(b) by 0 days.

(21) Appl. No.: 13/768,329

(22) Filed: Feb. 15, 2013

(65) Prior Publication Data

US 2014/0118458 A1 May 1, 2014

(30) Foreign Application Priority Data

Oct. 31, 2012 (TW) .............................. 101140414 A

(51) Int. Cl.
*B41J 2/45* (2006.01)
*H01L 31/12* (2006.01)
*H01L 27/15* (2006.01)

(52) U.S. Cl.
CPC ........ *B41J 2/45* (2013.01); *H01L 27/156* (2013.01)
USPC ............................................ 347/238; 257/84

(58) Field of Classification Search
USPC ........ 347/238; 257/79, 84, 77, 103, E33.006, 257/E33.011, E33.013, E33.014, E27.121
See application file for complete search history.

(56) References Cited

U.S. PATENT DOCUMENTS

| 5,821,567 | A  | * | 10/1998 | Ogihara et al. ................. 257/88 |
| 6,252,351 | B1 | * | 6/2001  | Koizumi et al. .............. 313/498 |
| 6,452,342 | B1 | * | 9/2002  | Ohno ......................... 315/169.1 |
| 8,502,849 | B2 | * | 8/2013  | Ohno ............................. 347/224 |

* cited by examiner

*Primary Examiner* — Hai C Pham
(74) *Attorney, Agent, or Firm* — Muncy, Geissler, Olds & Lowe, P.C.

(57) ABSTRACT

A light emitting diode (LED) array structure includes a substrate and a plurality of light emitting thyristors. The light emitting thyristors are arranged linearly on the substrate. Each light emitting thyristor includes a strip portion and a plate portion connected to each other, and the plate portions of the adjacent light emitting thyristors are staggered with each other, so as to maintain an arrangement density of the light emitting thyristors, and increase a distribution area of the light emitting thyristors. A printing head and a printing device with the foregoing LED array structure are also provided herein, so as to improve photoconductivity and printing speed of the printing device through the light emitting thyristors, which provide a raised light emission amount by increasing the distribution area.

17 Claims, 9 Drawing Sheets

LIGHT EMITTING DIODE ARRAY STRUCTURE, AND PRINTING HEAD AND PRINTING DEVICE THEREOF

CROSS-REFERENCES TO RELATED APPLICATIONS

This non-provisional application claims priority under 35 U.S.C. §119(a) on Patent Application No. 101140414 filed in Taiwan, R.O.C. on 2012 Oct. 31, the entire contents of which are hereby incorporated by reference.

BACKGROUND

1. Technical Field

The disclosure relates to a diode array structure, and more particularly to a light emitting diode (LED) array structure, and a printing head and a printing device thereof.

2. Related Art

A photocopier, a printer, a fax machine, and a multifunction peripheral use electro-photography as a core technology for printing a document; that is, the devices generate a photographic image by changing the distribution of electrostatic charges through light with a specific wavelength.

Please refer to FIG. 1, which is a schematic view of a LED printer 100 for color printing. The LED printer 100 has photoconductive drums (110K, 110M, 110C, and 110Y, referred to in sum as 110), printing heads (120K, 120M, 120C, and 120Y, referred to in sum as 120), and toner cartridges (130K, 130M, 130C, and 130Y, referred to in sum as 130), corresponding to black, magenta, cyan, and yellow respectively. Through a power distribution mechanism, a layer of uniform charges is generated on a surface of the photoconductive drum 110. In a scan procedure before printing, an exposure procedure is required to makes pixels of a pattern in a document to be printed convert to light and shade data of the visible light. The printing head 120 has a plurality of LEDs arranged along a one-dimensional direction. When light emitted by the LEDs is irradiated onto the photoconductive drum 110, potential of an unexposed area remains unchanged, but charges of an exposed area vary due to exposure. The variation of the potential of the exposed area may absorb carbon powder which is provided by the toner cartridge 130 and carries positive and negative charges, so as to achieve an objective of printing.

To improve the printing resolution, the LEDs in the printing head 120 are arranged tightly. For example, to reach a printing resolution of 600 DPI (Dots Per Inch), an interval of 42.3 μm between the LEDs is required. However, the area of an LED is further limited, and a light emission amount of the LED is limited. Therefore, how to improve the area of the LED to raise the light emission amount of the LED is a research subject of the researchers in the art.

SUMMARY

In view of the above problems, the disclosure provides a light emitting diode (LED) array structure, and a printing head and a printing device thereof, so as to raise a light emission amount of an LED and improve photoconductivity and printing speed.

An embodiment of the disclosure provides an LED array structure, including a substrate and a plurality of light emitting thyristors. The light emitting thyristors are located at the substrate and arranged linearly. Each light emitting thyristor includes a strip portion and a plate portion connected to each other, and the plate portions of the adjacent light emitting thyristors are staggered with each other.

An embodiment of the disclosure further provides a printing head, including the foregoing LED array structure.

An embodiment of the disclosure further provides a printing device, including a photoconductive drum, a lens, and a printing head with the foregoing LED array structure. The lens is located between the photoconductive drum and the printing head, and is used to focus light emitted by the printing head on the photoconductive drum.

To sum up, in the LED array structure, and the printing head and the printing device thereof according to the disclosure, the plate portions of the two adjacent light emitting thyristors in the LED array structure are located at different positions of the corresponding strip portions respectively. In this manner, an arrangement density of the light emitting thyristors is maintained and a distribution area of the light emitting thyristors is increased, so as to raise a light emission amount of the light emitting thyristors and then improve photoconductivity and printing speed of the printing device.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 1:
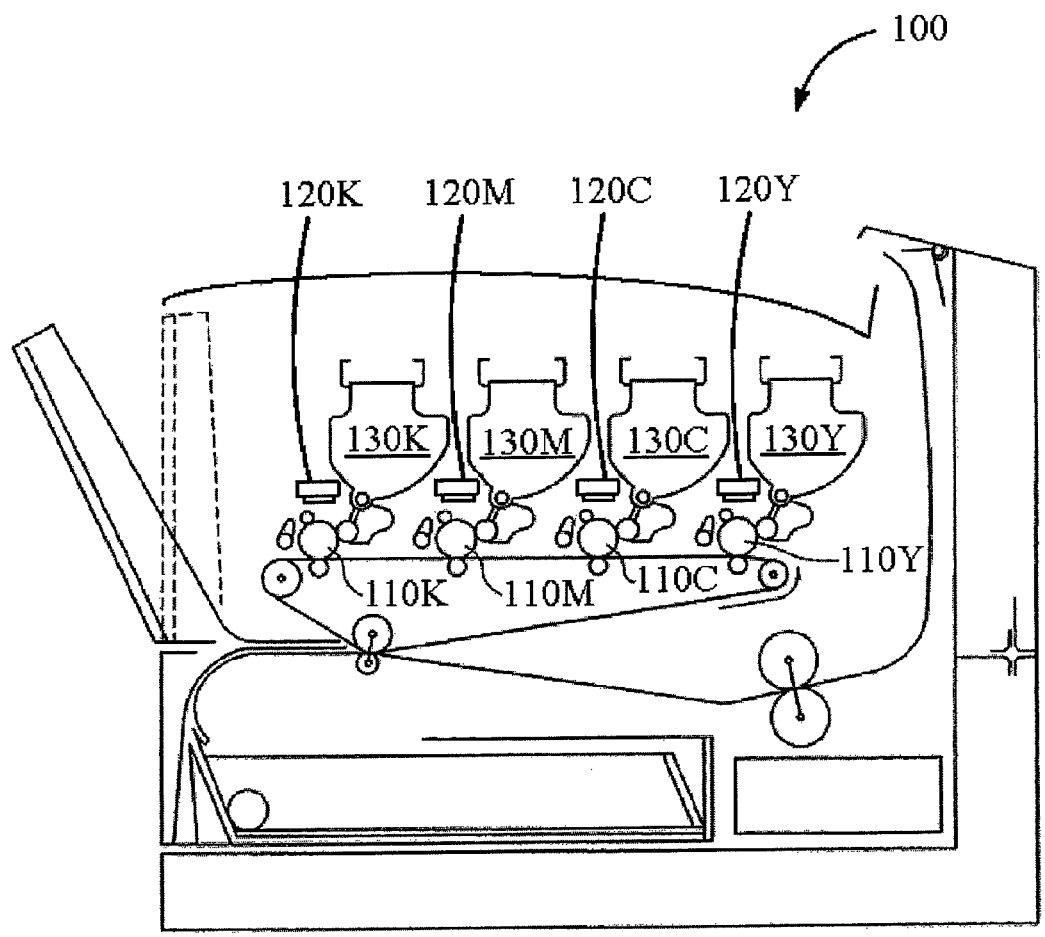
FIG. 1 is a schematic view of a conventional light emitting diode (LED) printer for color printing.
Figure 2:
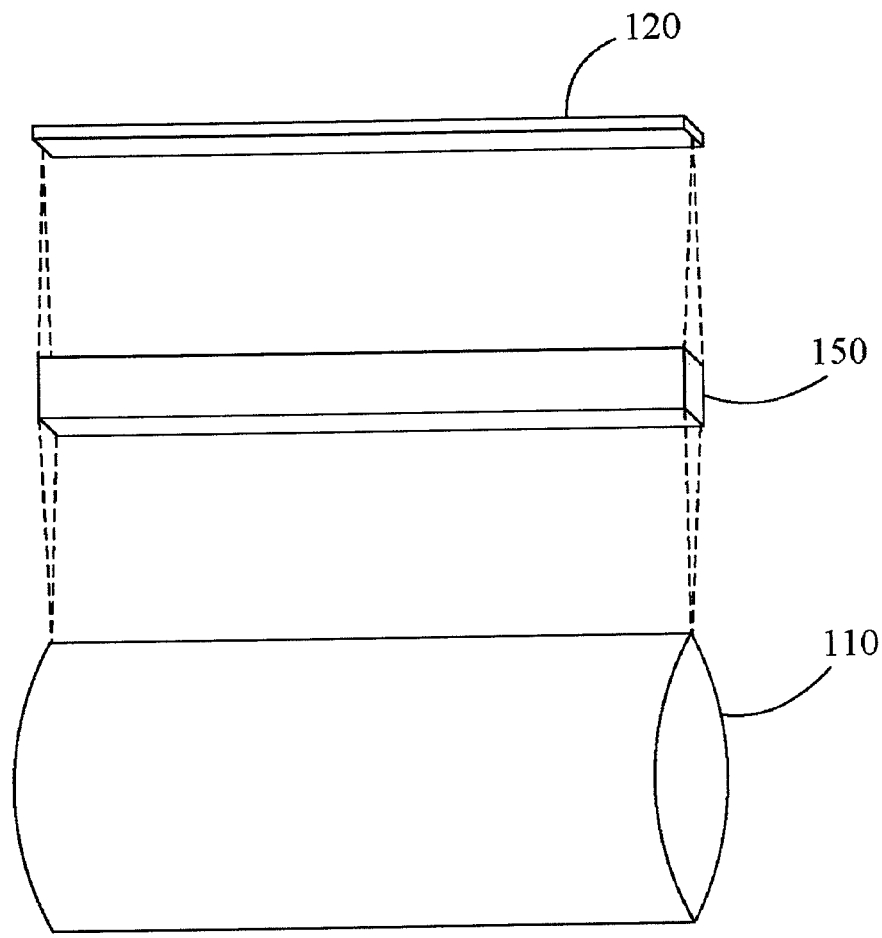
FIG. 2 is a schematic view of photoconductivity of a printing device according to an embodiment.

FIG. 2 is a schematic view of photoconductivity of a printing device according to an embodiment.

As shown in FIG. 2, the printing device includes a photoconductive drum 110, a printing head 120, and a lens 150. The lens 150 is located between the photoconductive drum 110 and the printing head 120, and is used to focus light emitted by the printing head 120 on the photoconductive drum 110, so as to implement the foregoing exposure procedure.

The number of the photoconductive drum 110, the printing head 120, and the lens 150 may be one to perform black-and-white printing. However, the embodiments of the disclosure are not limited thereto. The number of the photoconductive drums 110, the printing heads 120, and the lenses 150 may be four respectively to correspond to the purposes of color printing related to black, magenta, cyan, and yellow. The printing device may be a printer, a photocopier, a multifunction peripheral, and the like.

Figure 3:
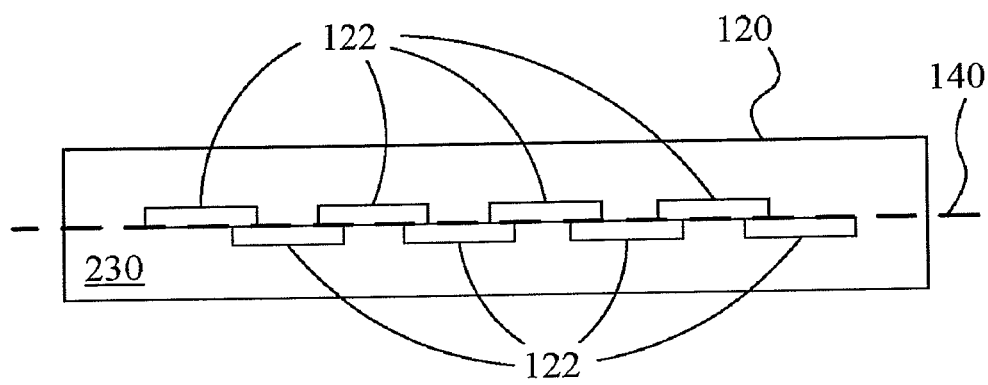
FIG. 3 is a schematic view of appearance of a printing head according to an embodiment.

FIG. 3 is a schematic view of appearance of the printing head 120 according to an embodiment.

As shown in FIG. 3, the printing head 120 includes a plurality of light emitting chips 122 arranged along an axis 140. Generally, each light emitting chip 122 includes thousands of light emitting thyristors arranged in a straight line. When the light emitting chips 122 are arranged along the axis 140, the light emitting thyristors are also arranged along the axis 140, so as to reach a printing resolution with high DPI. For example, to reach a resolution of 600 DPI, it is required to arrange 600 light emitting thyristors per inch.

Figure 4:
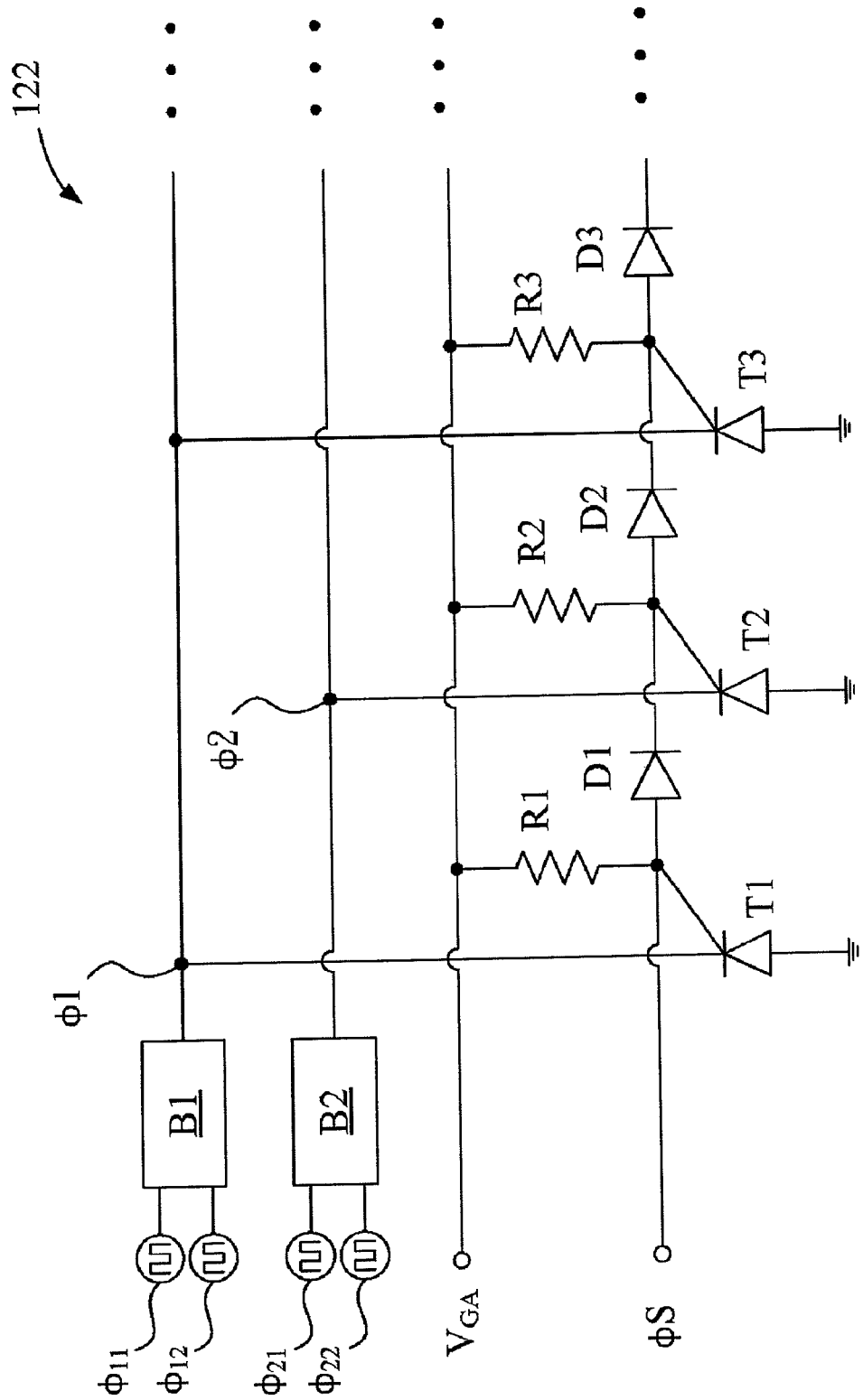
FIG. 4 is a schematic view of a circuit of a light emitting chip according to an embodiment.
Figure 5:
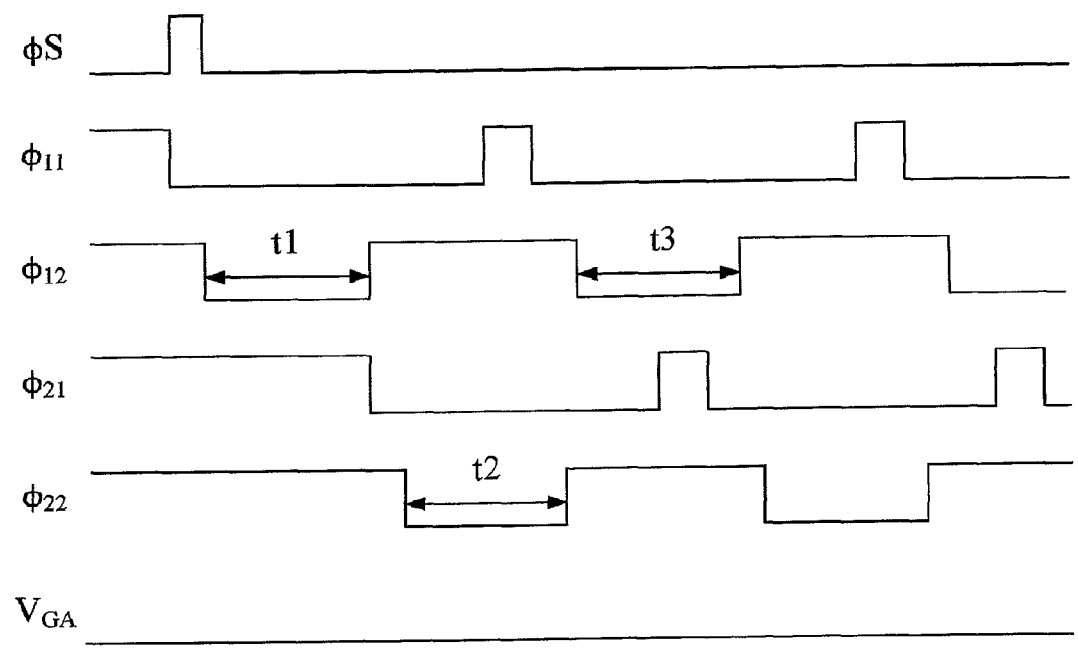
FIG. 5 is a schematic view of clock signals received by a light emitting chip according to an embodiment.

FIG. 4 is a schematic view of a circuit of the light emitting chip 122 according to an embodiment. FIG. 5 is a schematic view of clock signals received by the light emitting chip 122 according to an embodiment.

As shown in FIG. 4, the light emitting chip 122 includes light emitting thyristors (T1, T2, and T3, etc., totally called T), diodes (D1, D2, and D3, etc., totally called D), resistors (R1, R2, and R3, etc., totally called R), and buffers (B1 and B2).

The emitting thyristor T has a gate, a cathode, and an anode. When a voltage between the gate and the cathode is a forward bias and a voltage difference exceeds a diffusion voltage, the light emitting thyristor T is lit. Similar to a common thyristor, after the light emitting thyristor T is turned on (lit), the potential of the gate is almost the same as that of the anode; and when a potential difference between the gate and the cathode returns to zero volt, the light emitting thyristor T is turned off (unlit).

The gate of each light emitting thyristor T is coupled to another light emitting thyristor T through a corresponding diode D (for example, the light emitting thyristor T1 is coupled to the light emitting thyristor T2 through the diode D1). The cathode of each light emitting thyristor T is correspondingly coupled to signals φ11 and φ12 or signals φ21 and φ22 at intervals through the buffer (B1 or B2). For example, the cathode of the light emitting thyristor T1 is coupled to the signals φ11 and φ12 through the buffer B1, and the cathode of the light emitting thyristor T2 is coupled to the signals φ11 and φ12 through the buffer B2. A coupling part between the gate of each light emitting thyristor T and the corresponding diode D is coupled to a voltage $V_{GA}$ through a corresponding resistor R (for example, a coupling part between the gate of the light emitting thyristor T1 and the corresponding diode D1 is coupled to the voltage $V_{GA}$ through the resistor R1).

The gate of the light emitting thyristor T1 is also coupled to a signal φS. An anode end of the diode D is coupled to the adjacent light emitting thyristor T adjacent to the signal φS, and a cathode end of the diode D is coupled to another adjacent light emitting thyristor T. For example, the anode end of the diode D1 is couple to the light emitting thyristor T1, and the cathode end of the diode D1 is coupled to the light emitting thyristor T2.

The signals φ11, φ12, φ21, φ22, φS, and the voltage $V_{GA}$ are provided by a control module in the printing device (for example, clock signals shown in FIG. 5) to control the lighting time of each light emitting thyristor T (for example, a lighting time t1 of the light emitting thyristor T1, a lighting time t2 of the light emitting thyristor T2, and a lighting time t3 of the light emitting thyristor T3). That is, the control module can enable the corresponding light emitting thyristor T to be lit in sequence for a period according to a point to be exposed. Here, the control module may be implemented by a control chip, a driving circuit, or a combination thereof.

In an embodiment, in the same printing head 120, a plurality of light emitting chips 122 may share the same buffer B1 and the same buffer B2 to receive the signal φ1 and the signal φ2.

Figure 6:
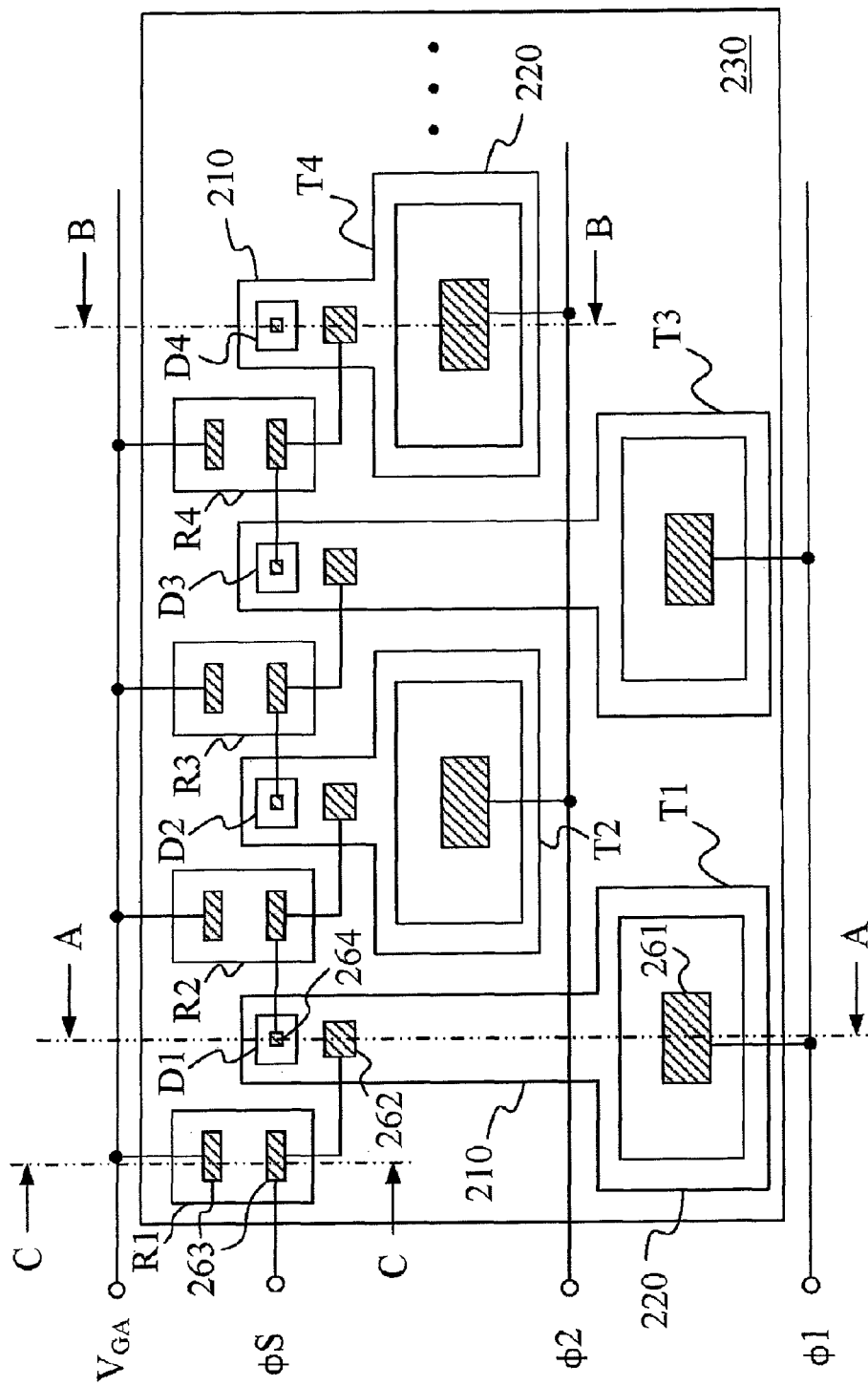
FIG. 6 is a schematic view of an LED array structure according to an embodiment.

FIG. 6 is a schematic view of an LED array structure according to an embodiment.

Please refer to FIGS. 3, 4, and 6 together, in which the LED array structure of the printing head 120 may include a substrate 230 and a plurality of lighting emitting thyristors T. As shown in FIG. 6, the light emitting thyristors T are arranged linearly on the substrate 230, that is, arranged along a one-dimensional direction. Each light emitting thyristor T includes a strip portion 210 and a plate portion 220 connected to each other. The plate portions 220 of the adjacent light emitting thyristors T are staggered with each other. A concave portion formed through the connection between the strip portion 210 and the plate portion 220 in the light emitting thyristor T is corresponding to the plate portion 220 of another adjacent light emitting thyristor T in a concavo-convex manner. In this manner, the area of the light emitting thyristor T is increased, and the space on the substrate 230 is used effectively. A long axis of the strip portion 210 is vertical to the arrangement direction of the light emitting thyristor T.

In an embodiment, the strip portion 220 is approximately rectangular, but the embodiment of the present invention is not limited thereto.

As shown in FIG. 6, the plate portion 220 of the light emitting thyristor T (for example, the light emitting thyristor T1, T2, T3, or T4), is located at a tail end of the strip portion 210. The light emitting thyristor T (for example, the light emitting thyristor T1 or T3), arranged at an odd position has a longer strip portion 210 than the light emitting thyristor T (for example the light emitting thyristor T2 or T4), at an even position, so that the light emitting thyristor T at the odd position is staggered with the light emitting thyristor T at the even position through their plate portions 220.

The embodiments of the disclosure are not limited to a case in which the adjacent light emitting thyristors T have the strip portions 210 with different lengths. The adjacent light emitting thyristors T may have strip portions with the same length, where the adjacent light emitting thyristors T are arranged in a staggered manner in a direction vertical to the arrangement direction.

Figure 7:
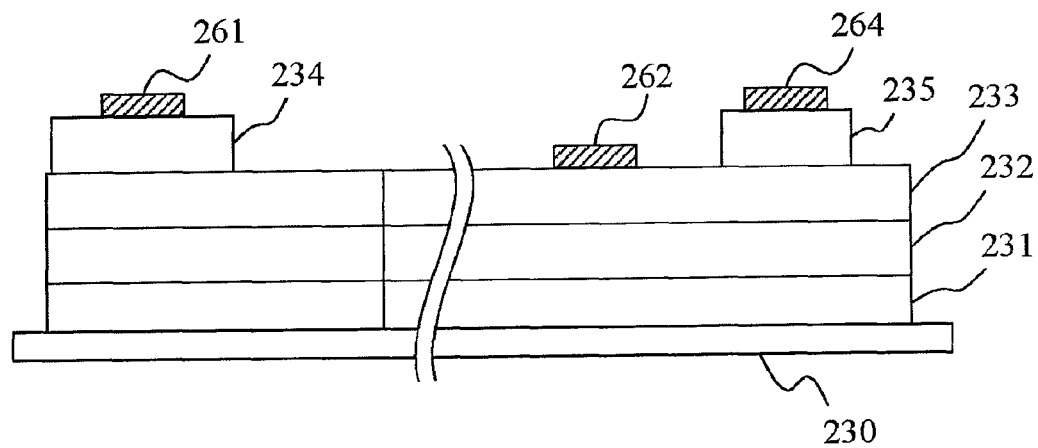
FIG. 7 is a sectional view along an A-A line according to FIG. 6.

FIG. 7 is a sectional view along an A-A line according to FIG. 6, and a sectional view of the light emitting thyristor T at the odd position. As shown in FIG. 7, both the strip portion 210 and the plate portion 220 have a first semiconductor layer 231, a second semiconductor layer 232, and a third semiconductor layer 233 stacked in sequence, and the plate portion 220 further includes a fourth semiconductor layer 234 stacked on the third semiconductor layer 233. That is, the light emitting thyristor T is formed by the first semiconductor layer 231, the second semiconductor layer 232, the third semiconductor layer 233, and the fourth semiconductor layer 234 stacked in sequence from bottom to top. The fourth semiconductor layer is located at the plate portion 220.

The first semiconductor layer 231 and the third semiconductor layer 233 are of the same conductivity type, and the second semiconductor layer 232 and the fourth semiconductor layer 234 are of the same conductivity type. The first semiconductor layer 231 and the second semiconductor layer 232 are of different conductivity types. For example, the first semiconductor layer 231 and the third semiconductor layer 233 are P-type semiconductors, and the second semiconductor layer 232 and the fourth semiconductor layer 234 are N-type semiconductors.

In this manner, each light emitting thyristor T includes an anode electrode (not shown), a cathode electrode 261, and a gate electrode 262. The cathode electrode 261 is disposed on the plate portion 220. The gate electrode 262 is disposed on the strip portion 210. The anode electrode is disposed on a contact surface between the light emitting thyristor T and the substrate 230.

As shown in FIG. 6 and FIG. 7, the strip portion 210 of each light emitting thyristor T further includes a fifth semiconductor layer 235 stacked on the third semiconductor layer 233. The fifth semiconductor layer 235 and the third semiconductor layer 233 are of different conductivity types to form the foregoing diode D. For example, when the third semiconductor layer 233 is a P-type semiconductor, the fifth semiconductor layer 235 is an N-type semiconductor. The cathode electrode 264 of the diode D is located at the fifth semiconductor layer 235, so as to connect to another electronic element in a wire-bonding manner.

Figure 8:
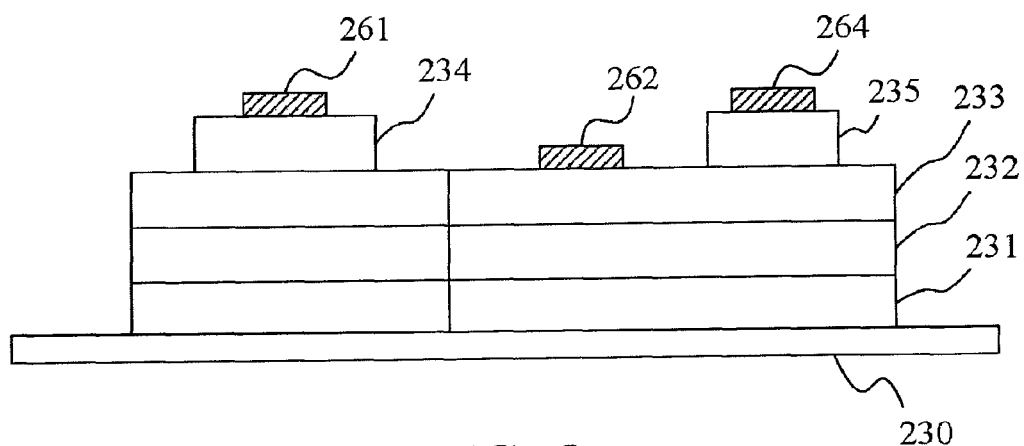
FIG. 8 is a sectional view along a B-B line according to FIG. 6.

FIG. 8 is a sectional view along a B-B line according to FIG. 6, and a sectional view of the light emitting thyristor T at the even position. As shown in FIG. 8, the light emitting thyristor T at the even position is similar to the light emitting thyristor T at the odd position shown in FIG. 7, and also has four conductive layers which are of different conductivity types and stacked in a staggered manner. The difference between FIG. 7 and FIG. 8 is that the strip portion 210 of the light emitting thyristor T arranged at the even position is shorter than the strip portion 210 of the light emitting thyristor T arranged at the odd position. However, the embodiments of the disclosure are not limited thereto. The strip portion 210 of the light emitting thyristor T arranged at the odd position may be shorter than the strip portion 210 of the light emitting thyristor T arranged at the even position.

Figure 9:
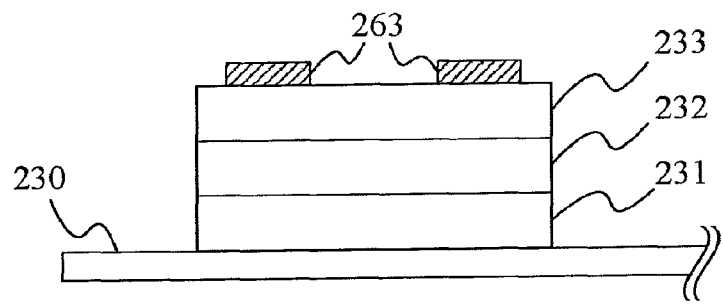
FIG. 9 is a sectional view along a C-C line according to FIG. 6.

FIG. 9 is a sectional view along a C-C line according to FIG. 6. Please refer to FIG. 6 and FIG. 9 together, in which the LED array structure further includes the foregoing plurality of resistors R. Each resistor R is located between the strip portions 210 of two adjacent light emitting thyristors T, that is, located on the width of the plate portion 220 protruding from the strip portion 210.

As shown in FIG. 9, the resistor R may also include the foregoing first semiconductor layer 231, the second semiconductor layer 232, and the third semiconductor layer 233. Therefore, in the fabrication of the LED array structure, the first semiconductor layer 231, the second semiconductor layer 232, and the third semiconductor layer 233 may be formed in sequence on the substrate 230, and the three semiconductor layers are cut to form the foregoing light emitting thyristor T and the resistor R.

A resistance electrode 263 may be disposed on the third semiconductor layer 233, so as to connect the resistor R to another electronic element in the wire-bonding manner.

Figure 10:
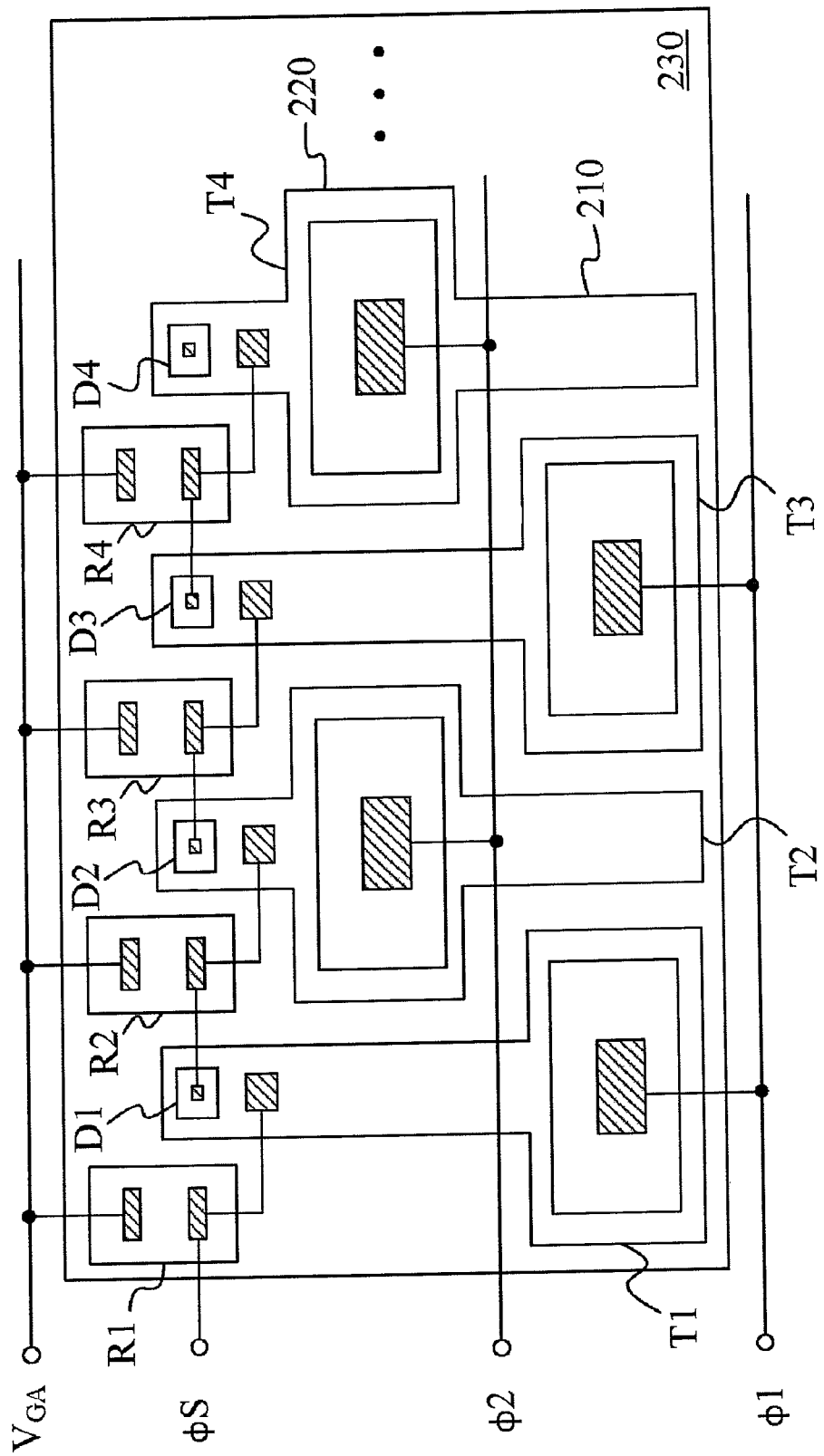
FIG. 10 is another schematic view of an LED array structure according to an embodiment.

FIG. 10 is another schematic view of an LED array structure according to an embodiment.

As shown in FIG. 10, the plate portion 220 of the light emitting thyristor T (for example, the light emitting thyristors T1 and T3), arranged at the odd position is located at the tail end of the strip portion 210, that is, one end of the light emitting thyristors T at the odd positions is narrower than the other end. The plate portion 220 of the light emitting thyristor T (for example, the light emitting thyristors T2 and T4), at the even position is located at (that is, strides over), a middle section of the strip portion 210. That is, the two ends of the light emitting thyristors T are narrower than the middle.

Therefore, the distribution area of the light emitting thyristors T arranged at the odd positions is the same as the distribution area of the light emitting thyristors T arranged at the even positions. That is, each light emitting thyristor T has equal total area of the plate portion 220 and the strip portion. In this manner, parasitic capacitance of each light emitting thyristor T is the same, so that the time required for lighting each light emitting thyristor T is the same. Therefore, the light emission amount of the light emitting thyristors T may be consistent.

Figure 11:
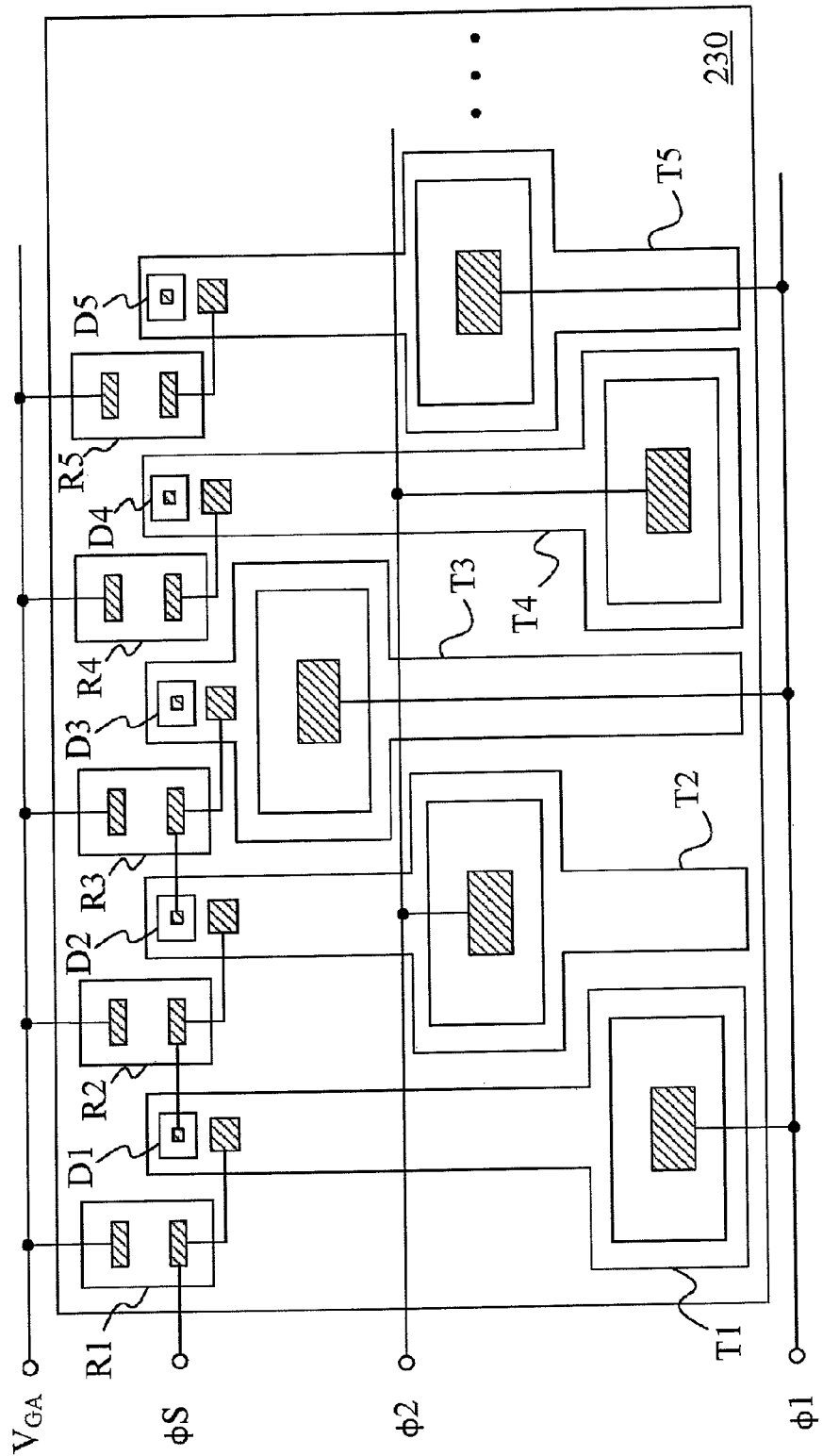
FIG. 11 is further another schematic view of an LED array structure according to an embodiment.

FIG. 11 is further another schematic view of an LED array structure according to an embodiment. FIG. 11 is approximately the same as FIG. 10, where the difference is that the position of the plate portion 220 of each light emitting thyristor T is different from that in FIG. 10.

As shown in FIG. 11, the plate portion 220 of the lighting emitting thyristor T arranged at an $N^{th}$ position is located at the tail end of the strip portion 210, the plate portion 220 of the lighting emitting thyristor T arranged at an $(N+1)^{th}$ position is located at the middle section of the strip portion 210, and the plate portion 220 of the lighting emitting thyristor T arranged at an $(N+2)^{th}$ position is located at the head end of the strip portion 210, in which N is a positive integer.

Figure 12:
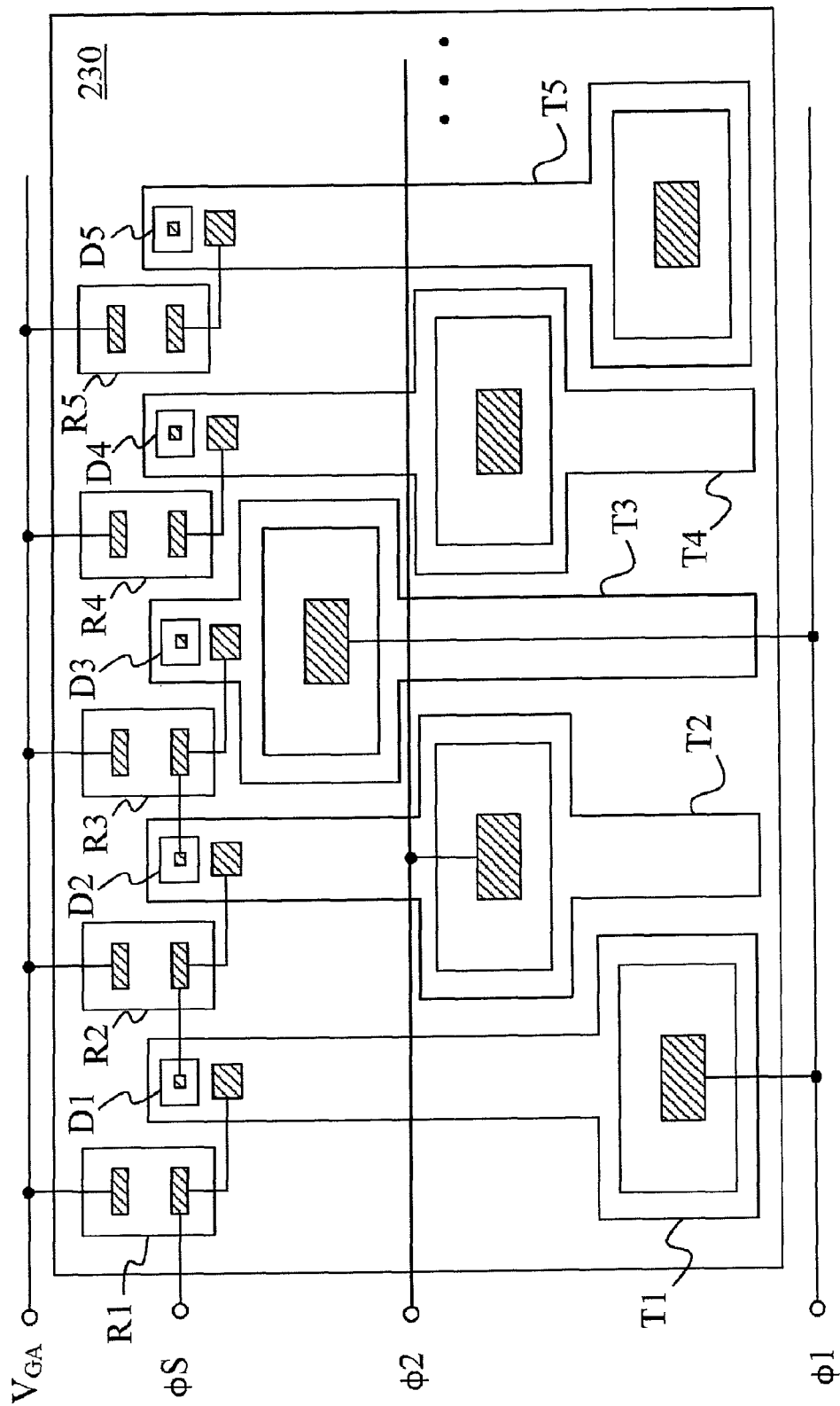
FIG. 12 is still another schematic view of an LED array structure according to an embodiment.

FIG. 12 is still another schematic view of an LED array structure according to an embodiment. FIG. 12 is approximately the same as FIG. 11, where the difference is that the position of the plate portion 220 of each light emitting thyristor T is different from that in FIG. 11.

As shown in FIG. 12, the plate portion 220 of the lighting emitting thyristor T arranged at the even position is located at the middle section of the strip portion 210, the plate portion 220 of the light emitting thyristor T arranged at a $(4M+1)^{th}$ position is located at the tail end of the strip portion 210, and the plate portion 220 of the lighting emitting thyristor T arranged at a $(4M+3)^{th}$ position is located at the head end of the strip portion 210, in which M is 0 or a positive integer.

To sum up, in the LED array structure, and the printing head 120 and the printing device thereof according to the disclosure, the plate portions 220 of the two adjacent light emitting thyristors T in the LED array structure are located at different positions of the corresponding strip portions 210. In this manner, the arrangement density of the light emitting thyristor T is maintained and the distribution area of the light emitting thyristor is increased, so as to raise the light emission amount of the LED and then improve photoconductivity and printing speed of the printing device.

While the present invention has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A light emitting diode (LED) array structure, comprising:
   a substrate; and
   a plurality of light emitting thyristors, arranged linearly on the substrate, wherein each light emitting thyristor comprises a strip portion and a plate portion connected to each other, the plate portions of the adjacent light emitting thyristors are staggered with each other, the plate portion of a part of the light emitting thyristors is located at a middle section of the strip portion of the part of the light emitting thyristors.

2. The LED array structure according to claim 1, wherein the plate portion of the lighting emitting thyristor arranged at an odd position is located at a tail end of the strip portion, and the plate portion of the light emitting thyristor arranged at an even position is located at a middle section of the strip portion.

3. The LED array structure according to claim 1, wherein the plate portion of the lighting emitting thyristor arranged at an $N^{th}$ position is located at a tail end of the strip portion, the plate portion of the light emitting thyristor arranged at an $(N+1)^{th}$ position is located at a middle section of the strip portion, and the plate portion of the light emitting thyristor arranged at an $(N+2)^{th}$ position is located at a head end of the strip portion, wherein N is a positive integer.

4. The LED array structure according to claim 1, wherein the plate portion is approximately rectangular.

5. The LED array structure according to claim 1, wherein each light emitting thyristor has equal total area of the plate portion and the strip portion.

6. The LED array structure according to claim 1, wherein both the plate portion and the strip portion comprise a first semiconductor layer, a second semiconductor layer, and a third semiconductor layer stacked in sequence, the plate portion further comprises a fourth semiconductor layer stacked on the third semiconductor layer, the first semiconductor layer and the third semiconductor layer are of the same conductivity type, the second semiconductor layer and the fourth semiconductor layer are of the same conductivity type, and the first semiconductor layer and the second semiconductor layer are of different conductivity types.

7. The LED array structure according to claim 1, further comprising a plurality of resistors, wherein each resistor is located between the strip portions of the two adjacent light emitting thyristors.

8. The LED array structure according to claim 1, where the strip portion of each light emitting thyristor further comprises a fifth semiconductor layer, stacked on the third semiconductor layer, and the fifth semiconductor layer and the third semiconductor layer are of different conductivity types, so as to form a diode.

9. A printing head, comprising:
a light emitting diode (LED) array structure comprising:
a substrate; and
a plurality of light emitting thyristors, arranged linearly on the substrate, wherein each light emitting thyristor comprises a strip portion and a plate portion connected to each other, the plate portions of the adjacent light emitting thyristors are staggered with each other, the plate portion of a part of the light emitting thyristors is located at a middle section of the strip portion of the part of the light emitting thyristors.

10. The printing head according to claim 9, wherein the plate portion of the lighting emitting thyristor arranged at an odd position is located at a tail end of the strip portion, and the plate portion of the light emitting thyristor arranged at an even position is located at a middle section of the strip portion.

11. The printing head according to claim 9, wherein the plate portion of the lighting emitting thyristor arranged at an $N^{th}$ position is located at a tail end of the strip portion, the plate portion of the light emitting thyristor arranged at an $(N+1)^{th}$ position is located at a middle section of the strip portion, and the plate portion of the light emitting thyristor arranged at an $(N+2)^{th}$ position is located at a head end of the strip portion, wherein N is a positive integer.

12. The printing head according to claim 9, wherein the plate portion is approximately rectangular.

13. The printing head according to claim 9, wherein each light emitting thyristor has equal total area of the plate portion and the strip portion.

14. The printing head according to claim 9, wherein both the plate portion and the strip portion comprise a first semiconductor layer, a second semiconductor layer, and a third semiconductor layer stacked in sequence, the plate portion further comprises a fourth semiconductor layer stacked on the third semiconductor layer, the first semiconductor layer and the third semiconductor layer are of the same conductivity type, the second semiconductor layer and the fourth semiconductor layer are of the same conductivity type, and the first semiconductor layer and the second semiconductor layer are of different conductivity types.

15. The printing head according to claim 9, wherein the LED array structure further comprising a plurality of resistors, wherein each resistor is located between the strip portions of the two adjacent light emitting thyristors.

16. The printing head according to claim 9, where the strip portion of each light emitting thyristor further comprises a fifth semiconductor layer, stacked on the third semiconductor layer, and the fifth semiconductor layer and the third semiconductor layer are of different conductivity types, so as to form a diode.

17. A printing device, comprising:
a photoconductive drum;
the printing head according to claim 9; and
a lens, located between the photoconductive drum and the printing head, and used to focus light emitted by the printing head on the photoconductive drum.

* * * * *